United States Patent
Sasaki

(10) Patent No.: US 11,499,886 B2
(45) Date of Patent: Nov. 15, 2022

(54) TEST METHOD OF A SEMICONDUCTOR DEVICE AND MANUFACTURING METHOD OF A SEMICONDUCTOR DEVICE

(71) Applicant: Mitsubishi Electric Corporation, Tokyo (JP)

(72) Inventor: Hajime Sasaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 330 days.

(21) Appl. No.: 16/755,433

(22) PCT Filed: Nov. 2, 2017

(86) PCT No.: PCT/JP2017/039744
§ 371 (c)(1),
(2) Date: Apr. 10, 2020

(87) PCT Pub. No.: WO2019/087355
PCT Pub. Date: May 9, 2019

(65) Prior Publication Data
US 2020/0319055 A1    Oct. 8, 2020

(51) Int. Cl.
*G01M 3/24* (2006.01)
*H01L 23/02* (2006.01)
*H01L 21/66* (2006.01)

(52) U.S. Cl.
CPC ........... *G01M 3/24* (2013.01); *H01L 22/34* (2013.01); *H01L 23/02* (2013.01)

(58) Field of Classification Search
CPC .......... G01M 3/24; G01R 31/26; H01L 22/12; H01L 22/34; H01L 23/02
See application file for complete search history.

(56) References Cited

U.S. PATENT DOCUMENTS 6,555,856 B1    4/2003  Staller
2005/0093533 A1*  5/2005  Christenson .......... G01M 3/186
                                                324/152
(Continued)

FOREIGN PATENT DOCUMENTS

JP    2000-135700 A    5/2000
JP    2004-023054 A    1/2004
(Continued)

OTHER PUBLICATIONS

An Office Action mailed by China National Intellectual Property Administration dated Dec. 16, 2021 which corresponds to Chinese Patent Application No. 201780096335.X and is related to U.S. Appl. No. 16/755,433 with English language translation.

(Continued)

*Primary Examiner* — Andres Munoz
(74) *Attorney, Agent, or Firm* — Studebaker & Brackett PC

(57) ABSTRACT

A test method for a semiconductor device having a package with airtight space, which is formed between a substrate wafer on which an element is formed and a cap wafer which is provided being opposite to the substrate wafer, comprises an applying water process in which the semiconductor device is exposed to high moisture atmosphere and cooled and a leak discrimination process in which power is supplied to the element which is formed on the substrate wafer and leak of the package is discriminated by detecting a sound wave which is generated by the semiconductor device.

19 Claims, 11 Drawing Sheets

(56) References Cited

U.S. PATENT DOCUMENTS

2007/0128759 A1\* 6/2007 Dewes ................... H01L 22/12
                                                                   257/E21.53
2020/0124492 A1\* 4/2020 Sasaki .................... H01L 22/26

FOREIGN PATENT DOCUMENTS

| JP | 2008-032658 A | 2/2008 |
| JP | 2010-245348 A | 10/2010 |

OTHER PUBLICATIONS

International Search Report issued in PCT/JP2017/039744; dated Jan. 16, 2018.

\* cited by examiner

TEST METHOD OF A SEMICONDUCTOR DEVICE AND MANUFACTURING METHOD OF A SEMICONDUCTOR DEVICE

TECHNICAL FIELD

This invention relates to air tightness evaluation of a semiconductor device having the structure of a wafer level chip scale package (WL-CSP).

BACKGROUND ART

An air tightness evaluation of a semiconductor device is evaluated by a method which is called as common name fine leak test, that is, after a device is manufactured, the device is exposed to helium atmosphere which is pressurized by several pressures, helium is injected to the device having poor airtightness, and helium which is invaded is evaluated by a helium detector (for example refer to Patent Document 1). Regarding the above mentioned method, it is required for several hours to pressurize helium and detect helium, it is difficult to evaluate devices individually, therefore, it is required to evaluate several tens to several hundreds devices all at once. Consequently, in a case where leak is found, it is necessary to abandon a test lot all at once, or it is necessary to divide devices to small amount of device and evaluate them for many times. As a result, there is a problem such that it is required times to perform a test. Further, in a case where a semiconductor device is a wafer level chip scale package, in comparison with general electronic devices, volume is smaller and an amount of helium to be injected is small, therefore there is a problem such that detection sensitivity of leak cannot be obtained sufficiently.

Further, regarding a method to test moisture resistance, there is a method in which while a device is operated, the device is exposed to high temperature high moisture atmosphere, based on change of device characteristic, leak is detected (for example Patent Document 2). According to the above mentioned method, in order to energize each device in high temperature high moisture state, an evaluation device having a complicated structure is necessary and there is a problem such that it is required for more than several days to detect leak.

PRIOR ART DOCUMENT

Patent Document

Patent Document 1: JP 2004-23054A
Patent Document 2: JP 2010-245348A

SUMMARY OF THE INVENTION

Problems to be Solved by the Invention

As above mentioned, regarding fine leak test, it is required time for a test, and in a case where the fine leak test is applied to a wafer level chip scale package, detection sensitivity of leak cannot be sufficiently obtained, therefore, test accuracy becomes worse. Further, regarding method which is disclosed by Patent Document 2, there is a problem such that it is required time for a test.

This invention is made for solving the above mentioned problems, and in a case where time for required for test is short and the test is applied to a wafer level chip scale package, an objective of this invention is to provide a test method having high detection sensitivity of leak for a semiconductor device.

Means for Solving Problems

A test method of a semiconductor device according to this invention is a method to test a semiconductor device having a package with airtight space, which is formed between a substrate wafer on which an element is formed and a cap wafer which is provided being opposite to the substrate wafer, and the test method comprises an applying water process in which the semiconductor device is exposed to high moisture atmosphere and cooled, and a leak discrimination process in which power is supplied to the element which is formed on the substrate wafer and by detecting a sound wave which is generated by the semiconductor device, leak of the package is discriminated.

Effect of Invention

According to this invention, in a leak test of wafer level chip scale package, a test which requires only short time and has high accuracy can be performed.

MODE FOR CARRYING OUT THE INVENTION

Embodiment 1

Figure 1:
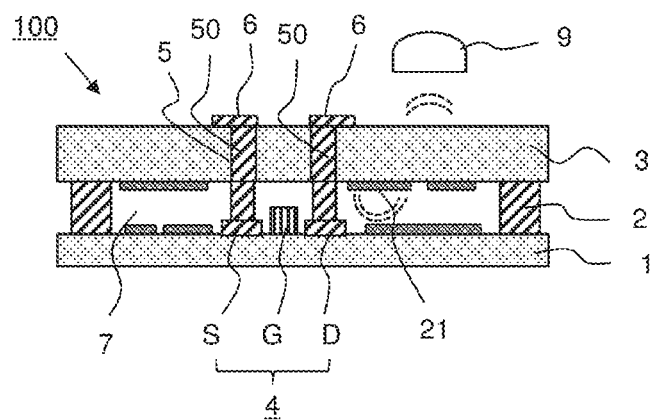
FIG. 1 is a cross section of a semiconductor device for describing a test method of a semiconductor device according to Embodiment 1 of this invention.

FIG. 1 is for describing a test method of a semiconductor device according to Embodiment 1 of this invention by using a cross section of a semiconductor device 100 which is an object of a test. On a substrate wafer 1 which is made of GaAs, for example, a transistor 4 for high frequency amplification is formed. In FIG. 1, as the transistor 4, a FET having a source S, a drain D and a gate G is shown as an example. As the transistor 4, it is not limited to FET, but any element which is formed on the substrate wafer 1, such as a semiconductor element other than a transistor or an integrated circuit is acceptable. Further, in many cases, a circuit which electrically connects between elements is formed. By a cap wafer 3 which is made of GaAs and a sealing frame 2 which is formed of gold, in an area where the transistor 4 is formed, the cap wafer 3 is provided being opposite to the substrate wafer 1 so as to form airtight space 7 whose air tightness is secured. In order to supply power to the transistor 4, on the cap wafer 3, a penetrating via hole (V/H) 5 is formed. An electrode pad 6 for supplying power from outside is connected to the via hole 5. The semiconductor device 100 having the above mentioned configuration is classified to be a semiconductor device which is called as a wafer level size package (which is also called as wafer level chip size package).

Figure 2:
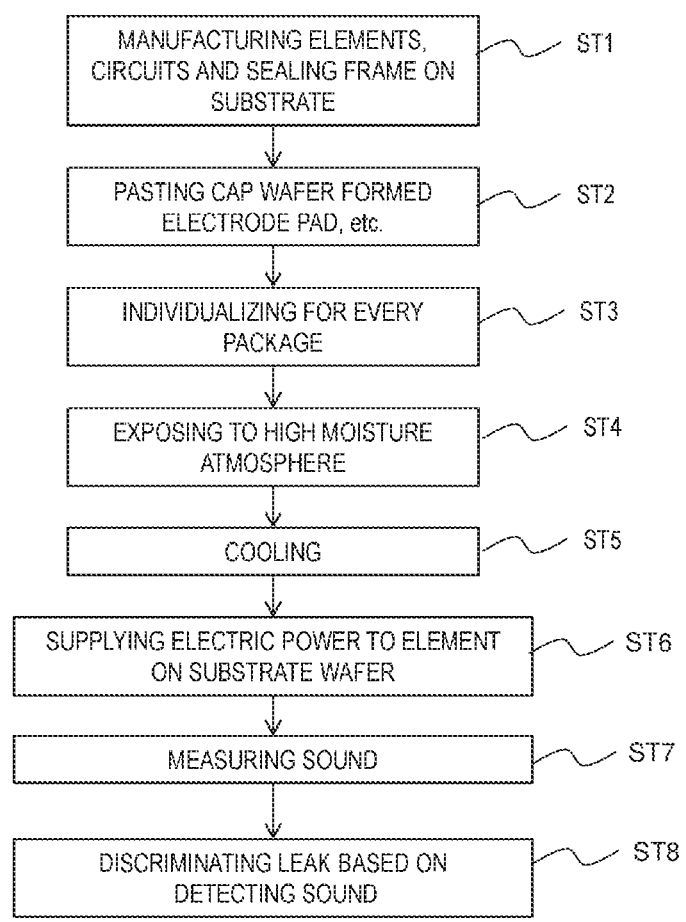
FIG. 2 is flow chart for showing a manufacturing method of a semiconductor device which includes a test method of a semiconductor device according to Embodiment 1 of this invention.

In a test method of a semiconductor device according to Embodiment 1, by operating an element of a semiconductor device 100, increasing a temperature inside of the device, and detecting a sound wave which is generated by a semiconductor device, it will be tested whether water 20 is contained in airtight space 7 of the semiconductor device 100. Hereinafter, the details of a test method will be described referring to flow chart of FIG. 2 which shows including a manufacturing method of a semiconductor device.

On the substrate wafer 1 which is made of GaAs, etc., the transistor 4 or a circuit will be manufactured by general device manufacturing process (Step ST1). At this time, the sealing frame 2 for air tight sealing will be separately manufactured on the substrate wafer 1 (Step ST1). The Step ST1 will be referred as an element forming process. The sealing frame 2 is formed, for example, of aggregation of gold grain, deposition, spattering or plating of gold. In many cases, in order to improve adhesiveness, not only gold but also a film of Ti, Cr, Pt, Pd, etc. is layered. After that, the cap wafer 3 which is made of a material which is similar to that of the substrate wafer 1 is pasted in a nitrogen atmosphere and with high temperature about 300° C. (Step ST2). In order to take out an electrode, a via hole 5 and a penetrating electrode 50 and an electrode pad 6 are formed on the cap wafer 3 in advance. In FIG. 1, an example in which an electrode is taken out from the cap wafer 3 is shown, however, a penetrating electrode may be formed on the substrate wafer 1. As above mentioned, a semiconductor device, which is configured by a plurality of packages having the air tight space 7 which is sealed with the sealing frame 2 between the substrate wafer 1 and the cap wafer 3, is individualized by dicing or scribing for every package (Step ST3). The Step ST2 and the Step ST3 will be referred as a package forming process.

Packages which are individualized will be exposed to high moisture atmosphere (Step ST4). Here, high moisture atmosphere will be referred to an atmosphere in which relative humidity is 80% or higher. Standard exposure condition is, for example, 85° C./85% (temperature/relative humidity) for about 1 day or 130° C./85% for about two hours. Generally, in a wafer level chip scale package, it is difficult to secure adhesion between the sealing frame 2 and the substrate wafer 1 and the cap wafer 3, and in some cases, air tightness cannot be sufficiently secured. In a case where the air tightness is poor, while a device is used, water is invaded from outside atmosphere to the air tight space 7 in the package, and by reacting the water and the transistor 4, oxidation of wafer, corrosion of an electrode, ion migration of metal will be induced so as to cause deterioration of a device. Consequently, securing airtightness is an important subject.

In a test method of a semiconductor device according to Embodiment 1, as an air tightness test, first, a semiconductor device will be exposed to high moisture atmosphere, and water will be injected accelerating and deliberately from a leak part. At this time, in a package where leak exists, an amount of water inside the package will be increased. After the semiconductor device is exposed to high moisture atmosphere, by cooling the semiconductor device (Step ST5), in a package where leak exists, as shown in FIG. 1, on inner surfaces of the substrate wafer 1 and the cap wafer 3, condensation is generated so as to form a water film 21. Here, Step ST4 and ST5 will be referred as an applying water process. After that, power is supplied so as to operate the transistor 4 as an element which is formed on the substrate wafer 1. When the transistor 4 is operated, a temperature will be increased, the water film 21 will be evaporated and inner pressure will be increased rapidly. By the rapid increase of inner pressure, the substrate wafer 1 and the cap wafer 3 will be deformed elastically and delicately, along with the deformation, faint sound will be generated. By detecting the sound wave with a high sensitive microphone 9 (Step ST7), presence of inside water can be judged and package leak can be discriminated individually by non-destructive test (Step ST8). FIG. 1 shows the configuration in which sound wave which is transmitted in air, however, by directly attaching the high sensitive microphone 9 to the cap wafer 3 or the substrate wafer 1, sound may be detected. Step ST6, ST7 and ST8 will be referred as a leak discrimination process.

In Embodiment 1, pressure increase due to temperature increase will be detected as sound. Regarding compound semiconductors, especially, a transistor for high frequency amplification having more than 1 mW output, generally in order to perform analog operation, a transistor generates heat. Temperature increase reaches to about 10° C. to 200° C. The temperature increase can be controlled freely by operation bias. As above mentioned, when inner pressure which is increased rapidly and due to the rapid increase of inner pressure, a wafer is expanded so as to push open air, sound pressure will be generated. The sound wave is extremely minute, however, by using high sensitive microphone, the sound wave can be detected. For example, a high sensitive microphone which is used in photoacoustic spectroscopy for measuring defect density of semiconductor device is a microphone which can detect sound wave which is generated in recombination of a pair of electron and hole, and by using the above mentioned microphone, sound wave according to this invention can be detected easily.

Even by using packages which are made of conventional ceramics, metal or resin, similar detection can be performed, however, ceramics and metal material are aggregations of poly crystal, and further, in many cases, packages have a laminated structure or a complicated structure in consideration of adhesion, mechanical strength and coefficient of thermal expansion. Therefore, microscopically, propagation speed of sound is different depending on parts, and it is considered such that in some cases, it is difficult to correctly detect variation of sound wave which is generated. In a case where a single crystal material such as GaAs is used as a material of package, propagation speed of sound is even and speed can be correctly estimated, therefore generation of sound can be explicitly detected. Consequently, it is preferable such that the cap wafer 3 is made of single crystal material. Especially, in a method for detecting a difference of propagation speed of sound wave in Embodiment 2 which will be described later, variation of propagation speed of sound wave is fatal, therefore, the necessity for using single crystal material for a package is extremely high.

Figure 3:
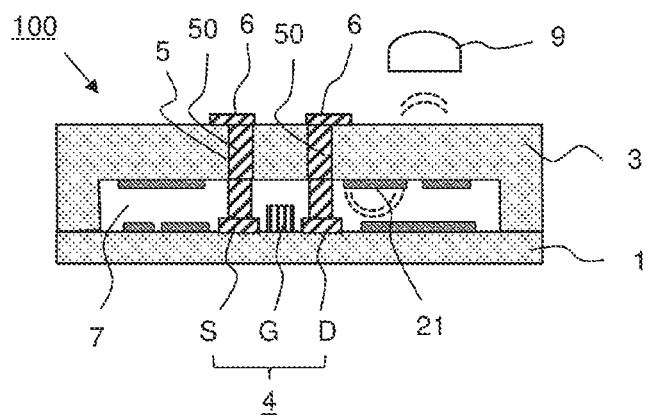
FIG. 3 is a cross section of another semiconductor device for describing a test method of a semiconductor device according to Embodiment 1 of this invention.

In FIG. 1, an example of a wafer level chip scale package in which space is formed by the sealing frame 2 is shown, however, as shown in FIG. 3, a wafer level chip scale package having other shape, in which air tight space 7 is formed by a cap wafer 3 having hollow and a substrate wafer 1 or air tight space is formed by a substrate wafer having hollow and a cap wafer can be applied. As above mentioned, a semiconductor device, which is configured by a package with airtight space between a substrate wafer on which an element is formed and a cap wafer which is provided being opposite to the substrate wafer, can be applied.

Embodiment 2

Figure 4:
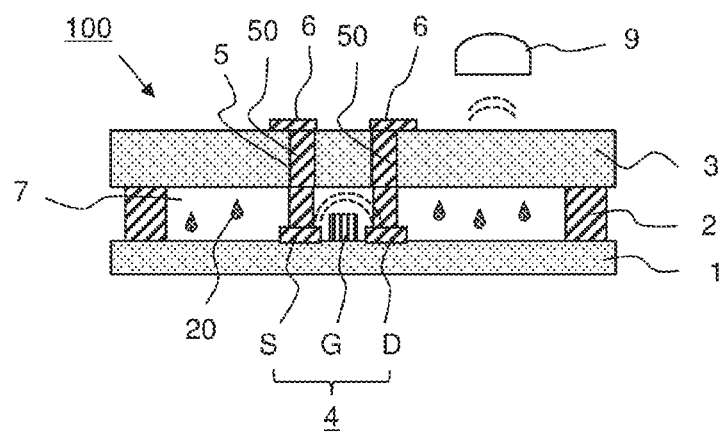
FIG. 4 is a cross section of a semiconductor device for describing a test method of a semiconductor device according to Embodiment 2 of this invention.
Figure 5:
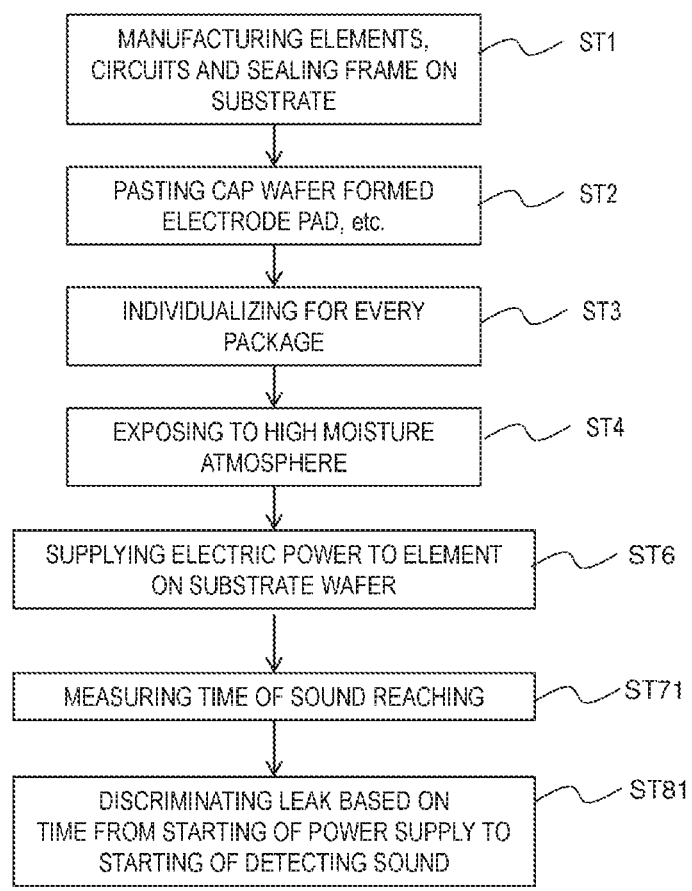
FIG. 5 is flow chart for showing a manufacturing method of a semiconductor device which includes a test method of a semiconductor device according to Embodiment 2 of this invention.

FIG. 4 is for describing a test method of a semiconductor device according to Embodiment 2 of this invention by using a cross section of a semiconductor device 100. Further, FIG. 5 is flow chart for showing including a manufacturing method of a semiconductor device. The semiconductor device 100 is the same as that shown in FIG. 1. In Embodiment 2, based on difference of propagation speed of sound which is generated when a transistor is operated, presence of inside water is judged, and leak in a package is discriminated.

The Steps ST1 to ST4 shown in FIG. 5 are same as those which are described in Embodiment 1. By exposing the semiconductor device to high moisture atmosphere in the same way as that in Embodiment 1 (Step ST4), water is injected to a package having leak. Here, the step ST4 will be referred as applying water process. After that, power is suppled for operating a transistor as an element which is formed on a substrate wafer 1 (Step ST6). Generally, by supplying power in pulse to a device which is formed on a substrate wafer which is made of compound semiconductor material such as GaAs, especially, a transistor for high frequency amplification having more than 1 mW output, a temperature of the transistor 4 will be increased by micro second order. Due to the temperature increase, gas around the transistor will be expanded and sound wave is generated, as a result, the sound wave will be propagated. The sound wave which reached the cap wafer 3 will make the cap wafer 3 deformed, the vibration will be propagated outside of the wafer to be sound wave, as a result, the sound wave can be detected with a high sensitive microphone.

Figure 6:
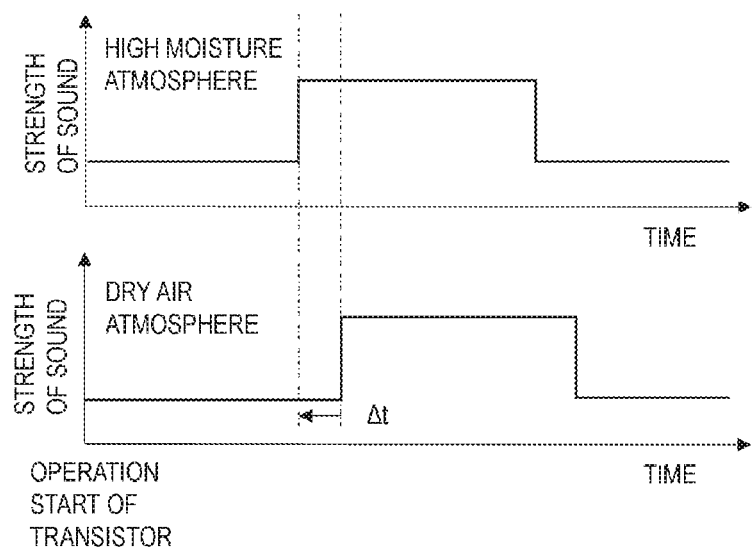
FIG. 6 is a diagram for describing a test method of a semiconductor device according to Embodiment 2 of this invention.

FIG. 6 shows time change of detection sound when a transistor is operated. For example, under the conditions of dry air 0° C., propagation speed of sound wave, that is, sound speed is about 331 m/s, and sound wave will be detected by microphone with a little delay from a beginning of transistor operation. In gas including water vapor, sound speed will be faster. As an extreme example, under the conditions of dry air 100° C., sound speed is 405 m/s, however, under the conditions of 100° C. and humidity 100%, sound speed is 477 m/s. When sound speed in a dry atmosphere is indicated as c, sound speed c' in humidity atmosphere will be calculated by following formula.

$$c' = \frac{c}{\sqrt{1 - \frac{p}{H}\left(\frac{\gamma_w}{\gamma} - 0.622\right)}} \quad \text{[Formula 1]}$$

Here, p indicates vapor pressure, H indicates barometric pressure, $\gamma_w$, indicates ratio of constant pressure specific heat of water vapor and constant volume specific heat of water vapor, and $\gamma$ indicates ratio of constant pressure specific heat of dry air and constant volume specific heat of dry air.

Based on the Formula 1 and package shape, water vapor volume can be estimated. As shown in FIG. 6, in a humid atmosphere, sound wave can be observed before when sound wave is observed in a dry atmosphere. Therefore, a package which does not contain water is used as a reference package, the time until sound wave is detected is measured with a reference package and a package which is test objective, and based on time difference $\Delta t$ until sound wave is detected, inside water vapor volume can be estimated. The time until sound wave is detected after a transistor is operated is approximately several micro seconds to less than millisecond. At this time, when humidity is different, maximum about 20% of difference of sound speed will be generated, therefore, it is easy to obtain humidity based on difference of time between that of reference package. As above mentioned, according to Embodiment 2, not only the presence of leak but also leak rate can conveniently be estimated.

Further, by operating a transistor with a pulse for a plurality of times, by measuring the time from pulse rise to detecting of sound every pulse, for example, by obtaining an average value of times which are measured, or by treating such as ignoring inaccurate measured value due to noise, test having higher accuracy can be performed.

Further, in the same way as that of Embodiment 1, after water is injected, a package is cooled to condensing conditions so as to form a water film, a transistor may be operated. When the state is condensation state, humidity in a package is kept to be 100%, therefore, in a package having leak, sound speed is faster, and the time until sound wave is detected becomes shorter. In a case where after a water film is formed and a transistor is operated, due to explosive evaporation of water film which is caused by calorie which is given by generating heat of a transistor, sound may be generated, however, the sound will be generated after a temperature of a package is increased. Consequently, the sound will be generated behind to some extent after power is started to supply to a transistor. On the other hand, regarding sound which is detected in Embodiment 2 which is generated by expansion of gas around a transistor due to temperature increase of a transistor itself, heat capacity of a transistor is small, therefore, the sound will be generated immediately after the time when power is started to supply to a transistor. As above mentioned, sound which is described in Embodiment 2 will be generated before the sound which is described in Embodiment 1 is generated, therefore, both of sounds can be distinguished.

Embodiment 3

Figure 7:
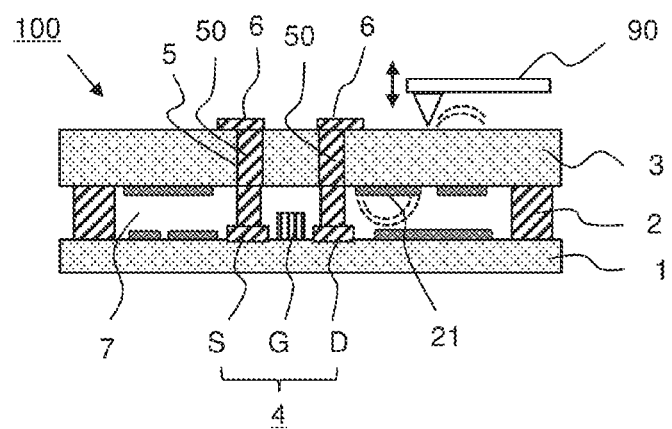
FIG. 7 is a cross section of a semiconductor device for describing a test method of a semiconductor device according to Embodiment 3 of this invention.
Figure 8:
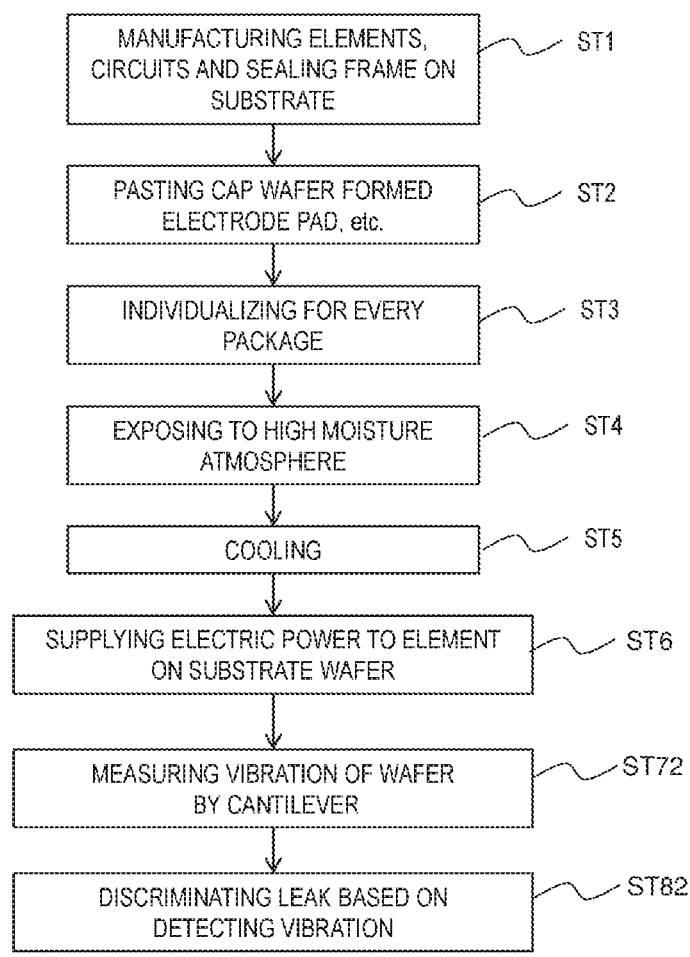
FIG. 8 is flow chart for showing a manufacturing method of a semiconductor device which includes a test method of a semiconductor device according to Embodiment 3 of this invention.

FIG. 7 is a diagram for describing a test method of a semiconductor device according to Embodiment 3 of this invention by using a cross section of a semiconductor device 100 which is an objective of test. Further, FIG. 8 is flow chart showing including a manufacturing method of a semiconductor device. A semiconductor device 100 is the same as that which is sown in FIG. 1.

In the same way as that of Embodiment 1, after a package is manufactured, by exposing the package to high moisture atmosphere, water will be injected to a package which has leak. After that, the package will be cooled so as to form water film and after that, a transistor will be operated so as to vibrate a wafer (Step ST1 to ST6). In Embodiment 3, as shown in FIG. 7, vibration of wafer will be measured by a cantilever 90 (Step ST72). As the cantilever 90, for example, a probe which is used in atomic force microscope will be used. The probe has the sensitivity which can sufficiently detect fluctuation of one atom, therefore, minute fluctuation of wafer can be detected with high sensitivity. Based on detecting the vibration, presence of water will be judged, and leak will be discriminated (Step ST82).

In FIG. 8, an example of detecting sound which was descried in Embodiment 1, however, measurement by a cantilever 90 can be applied to Embodiment 2. That is, by using a cantilever 90, the time from starting of operation of transistor to measuring vibration may be measured.

Embodiment 4

Figure 9:
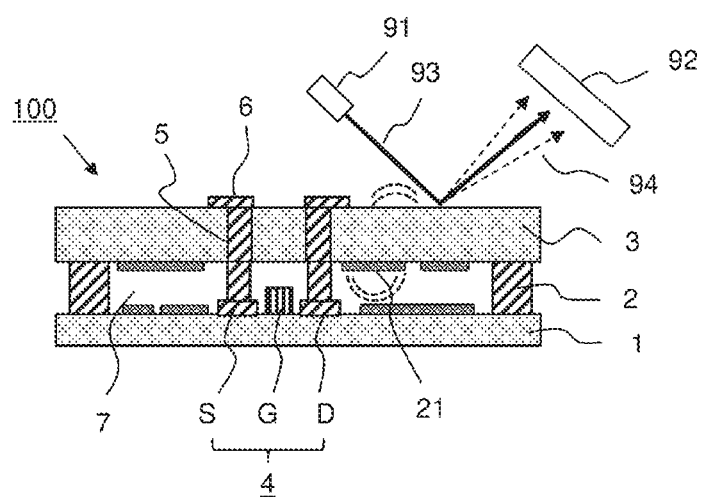
FIG. 9 is a cross section of a semiconductor device for describing a test method of a semiconductor device according to Embodiment 4 of this invention.
Figure 10:
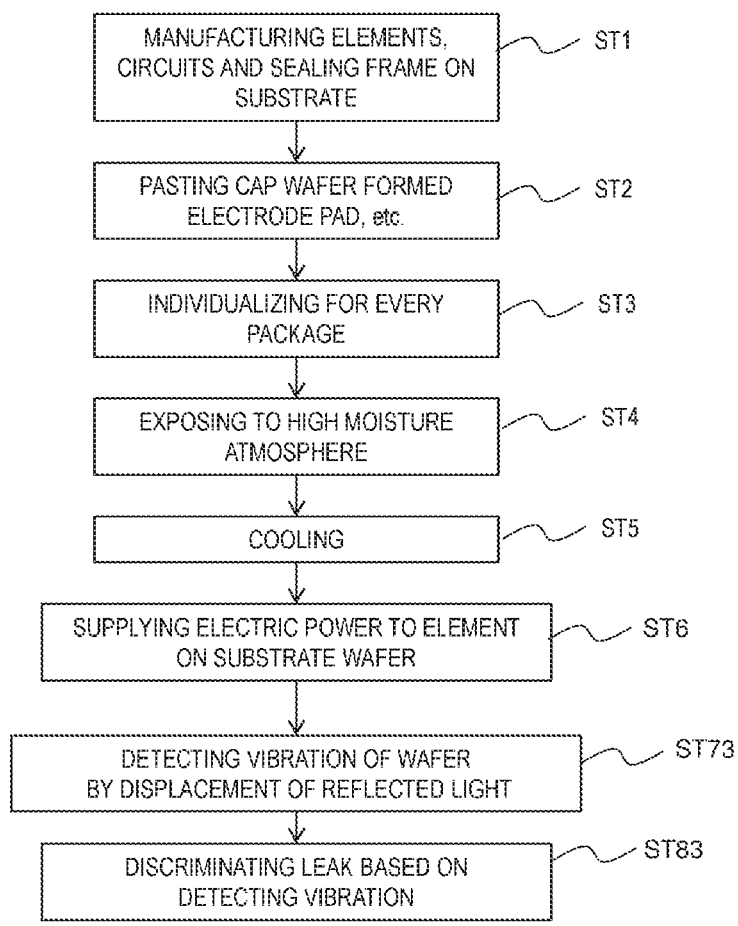
FIG. 10 is flow chart for showing a manufacturing method of a semiconductor device which includes a test method of a semiconductor device according to Embodiment 4 of this invention.

FIG. 9 is a diagram for describing a test method of a semiconductor device according to Embodiment 4 of this invention by using a cross section of a semiconductor device 100 which is an objective of test. Further, FIG. 10 is flow chart showing including a manufacturing method of a semiconductor device. A semiconductor device 100 is the same as that which is sown in FIG. 1.

In the same way as that of Embodiment 1, after a package is manufactured, by exposing the package to high moisture atmosphere, water will be injected to a package which has leak. After that, the package will be cooled so as to form water film and after that, a transistor will be operated so as to vibrate a wafer (Step ST1 to ST6). In Embodiment 4, as shown in FIG. 9, for example, light 93 from a light source like a laser 91 will be reflected on a surface of a cap wafer 3 to be light 94, and the light 94 is measured by light detector 92. When the cap wafer 3 is vibrated, reflected light will be displaced at a position of the light detector 92, therefore, vibration of the cap wafer 3 will be detected based on displacement of reflected light (Step ST73). A method of displacement of reflected light is used as a method to accurately detect variation amount of a cantilever with atomic force microscope, however, according to this invention, the above mentioned method is used to directly detect vibration of a wafer. In a case where a package is made of single crystal material, a surface is semiconductor mirror surface, therefore, flatness is excellent, therefore displacement of reflected light can be accurately detected. Consequently, it is preferable such that the cap wafer 3 is made of single crustal material. By detecting the above mentioned vibration, presence of water will be judged so as to discriminate leak (Step ST83).

In FIG. 10, an example of detecting sound which is described in Embodiment 1 is shown, however, a method for detecting vibration based on displacement of reflected light can be applied to Embodiment 2. That is, by measuring displacement of reflected light, time from starting operation of transistor to measuring vibration may be measured.

Embodiment 5

Figure 11:
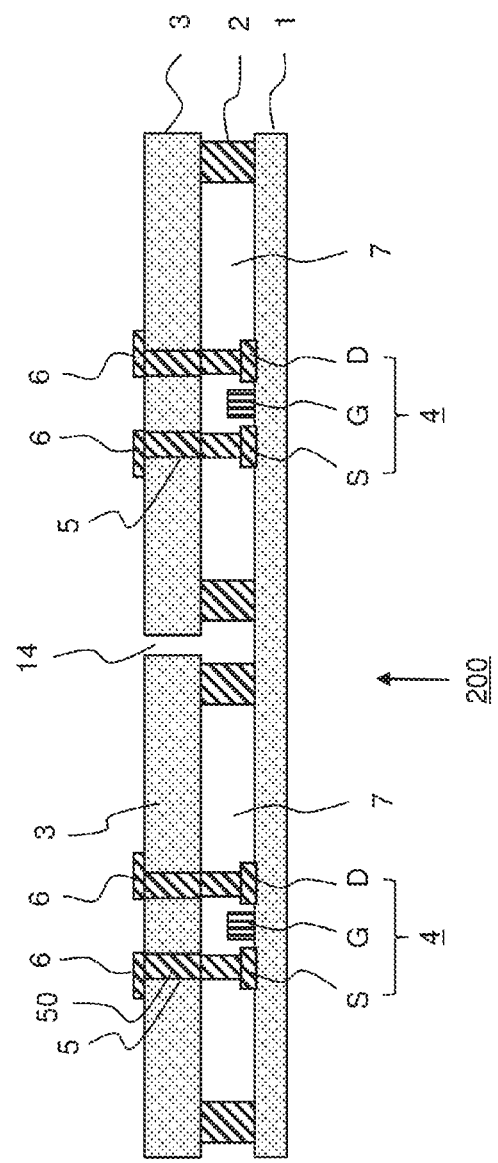
FIG. 11 is a cross section of a semiconductor device for describing a test method of a semiconductor device according to Embodiment 5 of this invention.
Figure 12:
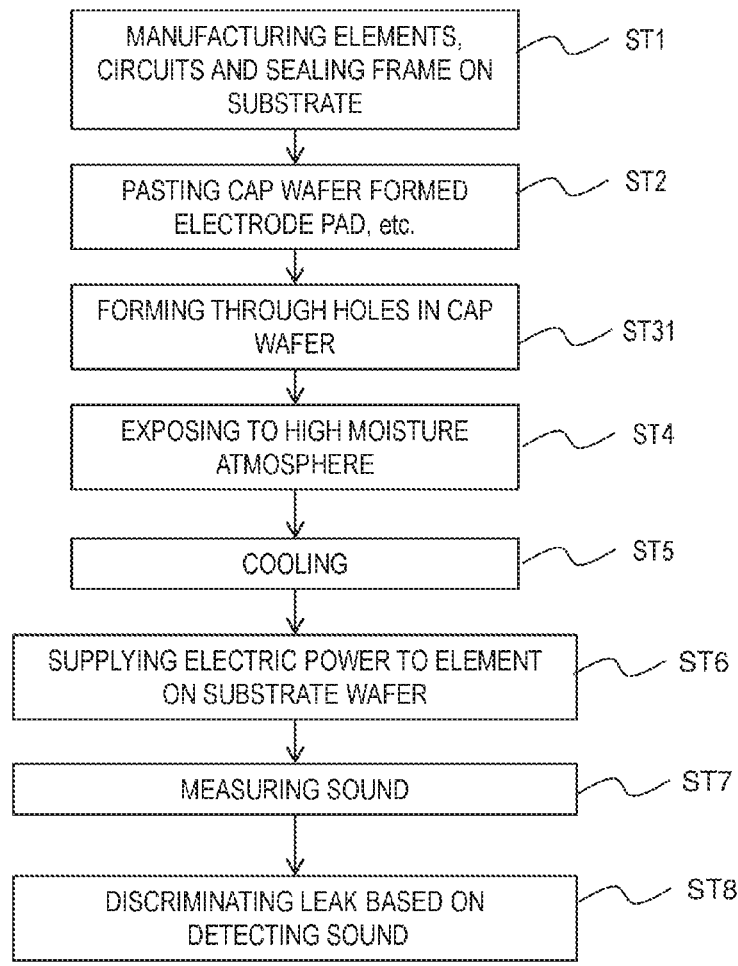
FIG. 12 is flow chart for showing a manufacturing method of a semiconductor device which includes a test method of a semiconductor device according to Embodiment 5 of this invention.

FIG. 11 is a diagram for describing a test method of a semiconductor device according to Embodiment 5 of this invention by using a cross section of a semiconductor device 200 which is an objective of test. Further, FIG. 12 is flow chart showing including a manufacturing method of a semiconductor device. In Embodiment 1, when a package is exposed to high moisture atmosphere, in order for water to invade to each package, it is necessary to cut each package into pieces by dicing. When a package is not cut into pieces, surroundings of each package are surrounded by other packages, therefore, water cannot be supplied from outside. In Embodiment 5, after a cap wafer is pasted (Step ST2), in order to supply water from outside to each package, in a cap wafer 3 which is situated between neighbor packages, a through hole 14 is formed (Step ST31). After that, the package is exposed to high moisture atmosphere (Step ST4). Water is supplied through the through hole 14 to each package.

Regarding a wafer level chip size package, in one wafer whose size is several inch, several hundreds to tens of thousands of packages are formed. When each package is individualized by dicing or scribing, handling or measuring in post-process will be complicated. In Embodiment 5, water can be supplied to each package through the through hole 14, therefore, it is not necessary to individualize a wafer, and it is possible to evaluate a wafer itself, therefore, handling will be easy and process will be simplified.

In FIG. 12, a method of Embodiment 1 is shown as an example of a method to discriminate leak by detecting sound, however, it is not necessary to mention such that a semiconductor device shown in FIG. 11 can be applied to any test method which was described in Embodiments 1 to 4.

Within the scope of this invention, each embodiment can be combined or each embodiment can be approximately changed or omitted.

EXPLANATION OF CHARACTERS 1 substrate wafer
3 cap wafer
4 transistor (element)
7 airtight space
20 water
21 water film
100, 200 semiconductor device

The invention claimed is:
1. A test method of a semiconductor device having a package with an airtight space, which is formed between a substrate wafer on which an element is formed and a cap wafer which is provided being opposite to the substrate wafer,
    wherein the test method comprises:
    an applying water process in which the semiconductor device is exposed to a high moisture atmosphere and cooled, and
    a leak discrimination process in which power is supplied to the element which is formed on the substrate wafer and by detecting a sound wave which is generated by the semiconductor device, a leak of the package is discriminated.

2. The test method of a semiconductor device according to claim 1, wherein
the cap wafer is made of a single crystal material.

3. The test method of a semiconductor device according to claim 1, wherein
the element to which power is supplied in the leak discrimination process is a transistor for high frequency amplification.

4. The test method of a semiconductor device according to claim 1, wherein
the sound wave is detected by a microphone.

5. The test method of a semiconductor device according to claim 1, wherein
the sound wave is detected by detecting vibration of the cap wafer using a cantilever.

6. The test method of a semiconductor device according to claim 1, wherein
the sound wave is detected by irradiating a light on a surface of the cap wafer and detecting vibration of the cap wafer based on displacement of reflected light which is reflected on the surface of the cap wafer.

7. A method of manufacturing a semiconductor device comprising:
an element forming process of forming elements on a substrate wafer,
a package forming process of forming a package with an airtight space in an area where the elements exist by providing a cap wafer being opposite to the substrate wafer, and
a process of discriminating leak in the package by the test method of a semiconductor device according to claim 1.

8. The method of manufacturing a semiconductor device according to claim 7, wherein
the package forming process includes:
forming a plurality of packages with regard to one piece of the substrate wafer and individualizing the plurality of packages.

9. The method of manufacturing a semiconductor device according to claim 7, wherein
the package forming process includes:
forming a plurality of packages with regard to one piece of the substrate wafer, and
forming a penetrating hole in the cap wafer which is between each of adjacent packages of the plurality of packages.

10. A test method of a semiconductor device having a package with an airtight space, which is formed between a substrate wafer on which an element is formed and a cap wafer which is provided being opposite to the substrate wafer, wherein
the test method comprises:
an applying water process in which the semiconductor device is exposed to a high moisture atmosphere, and
a leak discrimination process in which power is supplied to the element which is formed on the substrate wafer, a sound wave which is generated by the semiconductor device is detected, based on a length of time from starting supply of power to the element and detecting the sound wave, a leak of the package is discriminated.

11. The test method of a semiconductor device according to claim 10, wherein
the applying water process comprises:
exposing the semiconductor device to the high moisture atmosphere, and
cooling the semiconductor device.

12. The test method of a semiconductor device according to claim 10, wherein
the cap wafer is made of a single crystal material.

13. The test method of a semiconductor device according to claim 10, wherein
the element to which power is supplied in the leak discrimination process is a transistor for high frequency amplification.

14. The test method of a semiconductor device according to claim 10, wherein
the sound wave is detected by a microphone.

15. The test method of a semiconductor device according to claim 10, wherein
the sound wave is detected by detecting vibration of the cap wafer using a cantilever.

16. The test method of a semiconductor device according to claim 10,
wherein the sound wave is detected by irradiating a light on a surface of the cap wafer and detecting vibration of the cap wafer based on displacement of reflected light which is reflected on the surface of the cap waver.

17. A method of manufacturing a semiconductor device comprising:
an element forming process of forming elements on a substrate wafer,
a package forming process of forming a package with an airtight space in an area where the elements exist by providing a cap wafer being opposite to the substrate wafer, and
a process of discriminating leak in the package by the test method of a semiconductor device according to claim 10.

18. The method of manufacturing a semiconductor device according to claim 17, wherein
the package forming process includes:
forming a plurality of packages with regard to one piece of the substrate wafer, and
individualizing the plurality of packages.

19. The method of manufacturing a semiconductor device according to claim 17, wherein
the package forming process includes:
forming a plurality of packages with regard to one piece of the substrate wafer, and
forming a penetrating hole in the cap wafer which is between each of adjacent packages of the plurality of packages.

* * * * *